United States Patent [19]
Tajima et al.

[11] Patent Number: 6,072,377
[45] Date of Patent: Jun. 6, 2000

[54] SURFACE ACOUSTIC WAVE DEVICE WITH MULTIPLE CONNECTING ROUTES FOR CONNECTING FINGERS TO BUS BARS

[75] Inventors: Toshiyuki Tajima; Kunio Minami; Kenji Sakaguchi, all of Ishikawa-ken, Japan

[73] Assignee: Murata Manufacturing Co., Ltd., Japan

[21] Appl. No.: 09/241,205

[22] Filed: Feb. 1, 1999

[30] Foreign Application Priority Data

Feb. 6, 1998 [JP] Japan .................................. 10-025810

[51] Int. Cl.[7] ............................ H03H 9/145; H03H 9/25; H03H 9/42; H03H 9/64
[52] U.S. Cl. ...................... 333/154; 333/193; 310/313 B
[58] Field of Search ..................... 333/193–196, 333/150–154; 310/313 R, 313 B, 313 C, 313 D

[56] References Cited

U.S. PATENT DOCUMENTS

| | | | |
|---|---|---|---|
| 4,160,963 | 7/1979 | Hays, Jr. ............................. | 333/194 X |
| 4,866,325 | 9/1989 | Kodama et al. ................. | 310/313 B X |
| 4,918,349 | 4/1990 | Shiba et al. ....................... | 310/313 B |
| 4,999,535 | 3/1991 | Mariani et al. .................... | 310/313 B |

FOREIGN PATENT DOCUMENTS 62-61412   3/1987   Japan ..................................... 333/194

*Primary Examiner*—Robert Pascal
*Assistant Examiner*—Barbara Summons
*Attorney, Agent, or Firm*—Graham & James LLP

[57] ABSTRACT

A surface acoustic wave device includes a piezoelectric substrate, and comb-shaped electrodes each having a bus bar and a plurality of electrode fingers disposed on the piezoelectric substrate. At least one of the fingers and the bus bar are connected to each other via at least two different connecting portions at two different locations.

5 Claims, 6 Drawing Sheets

SURFACE ACOUSTIC WAVE DEVICE WITH MULTIPLE CONNECTING ROUTES FOR CONNECTING FINGERS TO BUS BARS

BACKGROUND OF THE INVENTION

1. Field of the Invention

The present invention relates to a surface acoustic wave device having an interdigital transducer disposed on a piezoelectric substrate.

2. Description of the Related Art

Figure 6:
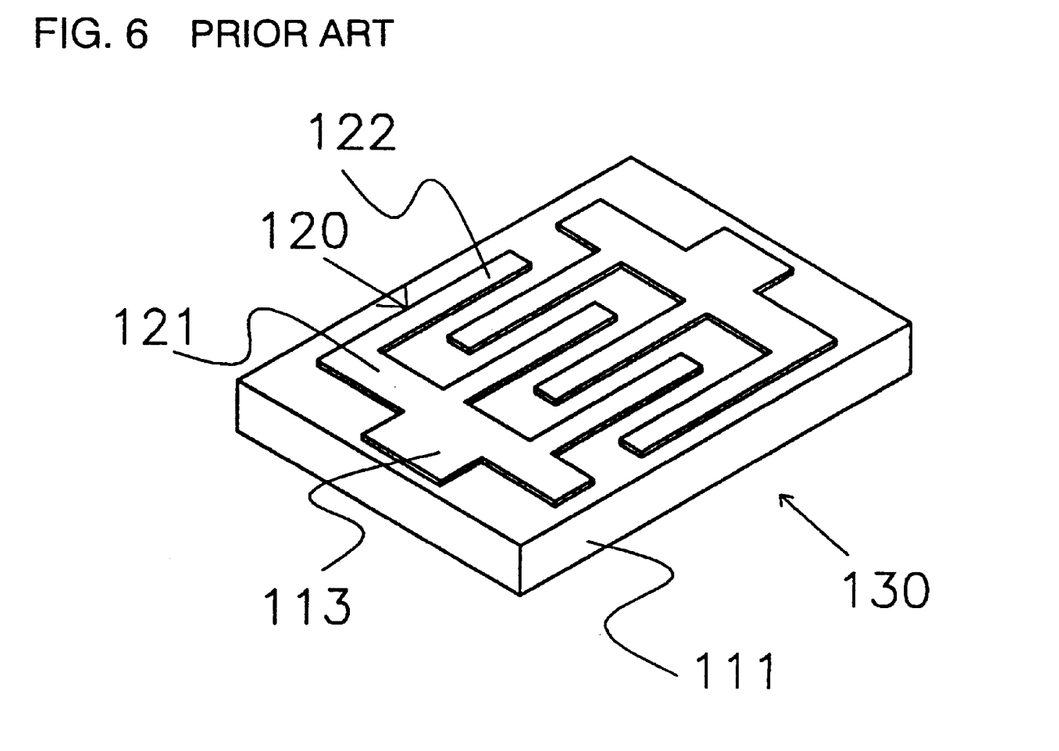
FIG. 6 is a perspective view of a conventional surface acoustic wave device.

A conventional surface acoustic wave device will be now described with reference to FIG. 6.

The conventional surface acoustic wave device 130 includes a piezoelectric substrate 111 made of LiTaO$_3$, LiNbO$_3$, or the like, and a pair of comb-shaped electrodes 120 made of Al or the like, disposed opposite to each other on the piezoelectric substrate 111 so as to define an interdigital transducer. Each of the comb-shaped electrodes 120 has a plurality of electrode fingers 122 and a bus-bar 121 to which one of the ends of each of the electrode fingers are connected.

On the piezoelectric substrate 111, a bonding pad 113 is connected to the bus bar 121. This surface acoustic wave filter is accommodated in a package which is not shown in FIG. 6. The bonding pad 113 and a pad (not shown) provided in the package are connected via wire bonding.

In recent years, mobile communication systems or the like operating at high frequency have been advanced more widely. It is required that surface acoustic devices for use in such systems satisfy increasing high frequency requirements.

A surface acoustic wave device is designed based on material factors such as an electromechanical coupling factor, a reflectivity of a reflector, and so forth. These material factors depend on a ratio (h/$\lambda$) of the film thickness (h) of the interdigital transducer to a wave length ($\lambda$) of a surface acoustic wave which is excited on the substrate. Ordinarily, the ratio (h/$\lambda$) of a wavelength relative to a film thickness is limited to the ranges of several percent to ten percent, due to the electric characteristics of the surface acoustic wave device. Accordingly, it is necessary to reduce the film thickness h of the interdigital transducer in accordance with the shorter wave length $\lambda$ to cope with the requirements for the surface acoustic wave device operating in a short wavelength band, namely, at a high frequency wave band.

However, the surface acoustic wave device is exposed to high temperature conditions during the production steps thereof or during the operation thereof. It has been discovered by the inventors of the present invention, that in such a high temperature environment, defects may be caused in the interdigital transducer such as a small thickness and low strength, due to a difference between the coefficients of linear expansion of the piezoelectric substrate and of the interdigital transducer. Thus, such defects tend to occur in a wide-area portion of the interdigital transducer. That is, such defects are often caused in a bus bar, particularly, in an edge of the bus bar. In the event that a defect occurs in the connection location between a finger of the comb-shaped electrode and the bus bar, the finger and the bus bar are disconnected from each other which causes problems in the characteristics of the surface acoustic wave device, such as increasing of the insertion loss, changing of the frequency band, and other problems.

SUMMARY OF THE INVENTION

To overcome the problems described above, preferred embodiments of the present invention provide a surface acoustic wave device in which the characteristics thereof are prevented from being deteriorated even when exposed to a high temperature environment.

According to one preferred embodiment of the present invention, a surface acoustic wave device includes a piezoelectric substrate and comb-shaped electrodes each having a bus bar and a plurality of fingers disposed on the piezoelectric substrate, wherein at least one of the fingers and the bus bar are connected through at least two different connecting portions at two different locations.

Fingers which are adjacent to each other and connected to the same bus bar are connected to each other through a finger connecting electrode provided in the vicinity of the connection locations between the fingers and the bus bar.

Further, the finger connecting electrode and the bus bar are connected to each other through a bus bar connecting electrode.

According to another preferred embodiment of the present invention, a surface acoustic wave device includes a piezoelectric substrate and comb-shaped electrodes each having a bus bar and a plurality of fingers disposed on the piezoelectric substrate, wherein at least one portion of the bus bar located near connection portions connecting the bus bar and the fingers is removed so that a remaining bus bar is defined, and the fingers which are adjacent to each other and connected to the same bus bar are connected to each other through the remaining bus bar at a location near the connection portions extending between the bus bar and the fingers.

Further, a portion of the bus bar located near connection portions which extend between the bus bar and the fingers is removed so that the remaining bus bar connecting the fingers which are adjacent to each other, and a bridging bus bar connecting the remaining bus bar to a substantial bus bar are formed.

Accordingly, even if a defect occurs in the connection locations between the bus bar and the fingers of the comb-shaped electrode, which defect may be caused, for example, by a difference between the coefficients of linear expansion of the piezoelectric substrate and of the comb-shaped electrode, the conduction between the fingers and the bus bar is possible through the other connecting portions or routes having no defect. Thus, an increase in the insertion loss and changing of the frequency band of the surface acoustic wave device can be prevented.

In addition, the line widths of the two-connecting portion electrodes for connecting the finger to the bus bar, the finger connecting electrode, the bus bar connecting electrode, the remaining bus bar, and the bridging bus bar are nearly equal to the line width of the fingers.

Accordingly, it is possible to prevent the electrical resistance from being increased and to prevent the likelihood of defects from being increased, which is caused by narrowing and widening of the line widths, respectively.

For the purpose of illustrating the present invention, there is shown in the drawings several preferred embodiments and forms which are presently preferred, it being understood, however, that the invention is not limited to the precise arrangements and instrumentalities shown.

DETAILED DESCRIPTION OF PREFERRED EMBODIMENTS

Figure 1:
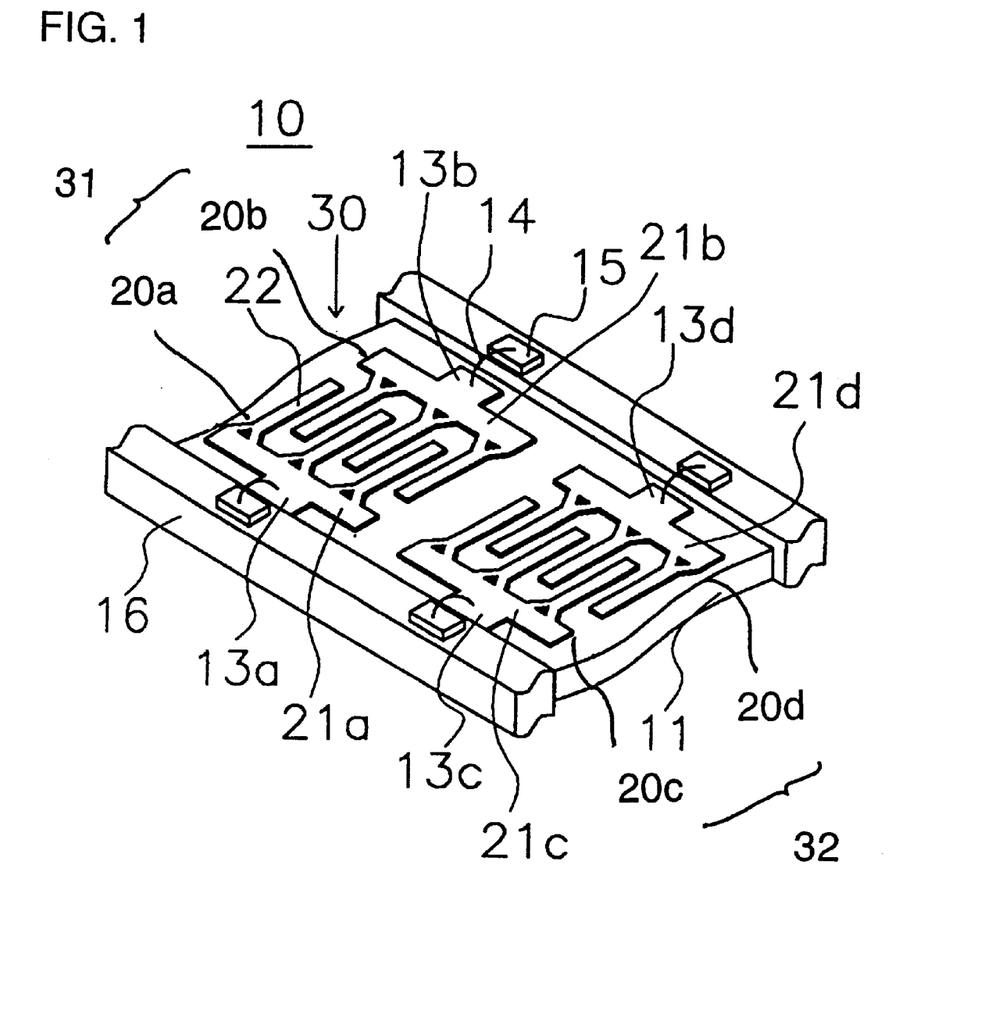
FIG. 1 is a partial schematic perspective view of a surface acoustic wave filter according to a preferred embodiment of the present invention.

A surface acoustic wave device according to a preferred embodiment of the present invention will be now described with reference to FIG. 1. FIG. 1 shows a part of a surface acoustic wave device 30.

As shown in FIG. 1, the surface acoustic wave device 30 includes a piezoelectric substrate 11 preferably made of $LiTaO_3$, $LiNbO_3$, quartz, or other suitable material, and interdigital transducers 31 and 32 preferably made of Al and disposed on the piezoelectric substrate 11. The interdigital transducer 31 includes a pair of comb-shaped electrodes 20a and 20b which include a plurality of electrode fingers 22 and bus bars 21a and 21b, respectively, to which all the electrode fingers 22 are connected so that the pair of comb-shaped electrodes 20a and 20b are interdigitated with each other. In the same manner, the interdigital transducer 32 includes a pair of comb-shaped electrodes 20c and 20d which include of plurality of electrode fingers 22 and bus bars 21c and 21d, respectively, to which all the electrode fingers 22 are connected so that the pair of comb-shaped electrodes 20a and 20b are interdigitated with each other.

The line width and the line pitches of the electrode fingers 22 and the thicknesses of the interdigital transducers 31 and 32 are preferably formed via photolithography such that desired characteristics are achieved, as described below.

In this preferred embodiment, the surface acoustic wave device 30 is preferably used as a transversal surface acoustic wave filter 10. On the piezoelectric substrate 11, bonding pads 13a, 13b, 13c, and 13d are arranged so as to be connected to the bus bars 21a, 21b, 21c, and 21d, respectively. The surface acoustic wave filter 10 is provided in a package 16 (shown in part in FIG. 1). The bonding pads 13a, 13b, 13c, and 13d are connected via wires 14 to pads 15 provided in the package 16. Further, the bonding pad 13b of interdigital transducer 31 and the bonding pad 13c of the interdigital transducer 32 are connected to ground through the pads 15 of the package 16.

A signal is input to the bonding pad 13a of the interdigital transducer 31, and a surface acoustic wave is excited in the finger portion of the interdigital transducer 31. The surface acoustic wave propagates to the interdigital transducer 32, and an output signal is output from the bonding pad 13d of the interdigital transducer 32.

Figure 2:
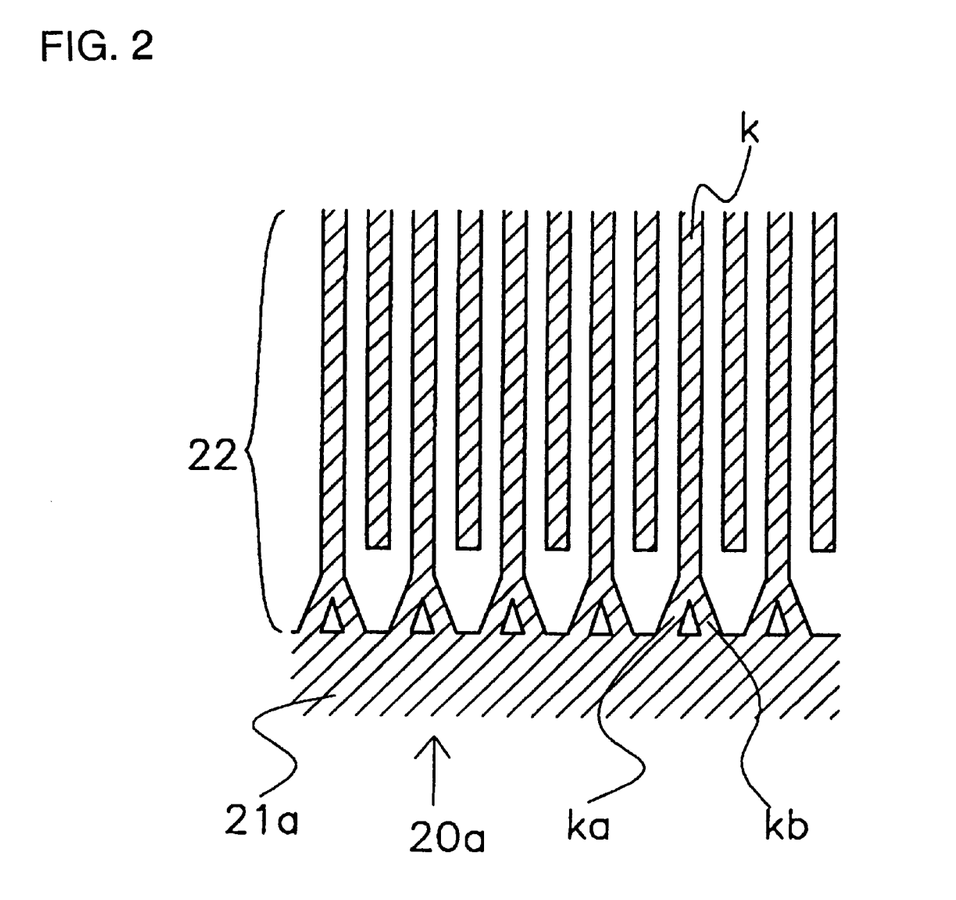
FIG. 2 is a partial, enlarged plan view of the bus bar and fingers of a first preferred embodiment according to the present invention.

FIG. 2 illustrates the connection between the electrode fingers 22 of the comb-shaped electrode 20a and the bus bar 21a. As shown in FIG. 2, the comb-shaped electrode 20a includes n fingers 22 (n is a natural number equal to one or more), and the bus bar 21a. The kth finger (k is a natural number of 1 through n) of the comb-shaped electrode 20a is branched into two connection portions or routes ka, kb in the vicinity of the connection location between the kth finger and the bus bar 21a. Thus, the kth finger is connected to the bus bar 21a through connecting portions at two isolated and different locations of the bus bar 21a. Accordingly, even if a defect occurs in the connection portion between the bus bar 21a and the connection portion ka so as to disconnect the connection portion ka from the bus bar 21a, the kth finger and the bus bar 21a are still electrically connected and kept in the conducting state through the connection portion kb. Thus, it is much less likely that the insertion loss is increased and the frequency band is changed, which results from disconnection between the bus bar 21a and the kth finger.

As can be appreciated, each of the electrode fingers 22 in the comb-shaped electrodes 20b, 20c and 20d is also connected to bus bars 21b, 21c and 22d through two connecting portions or routes, respectively, in a manner similar to that described above.

A second preferred embodiment of the present invention will be described below. The description of like parts in the above-described preferred embodiments is omitted, and only the connection between the bus bar and the fingers of the comb-shaped electrodes will be explained with reference to FIG. 3.

Figure 3:
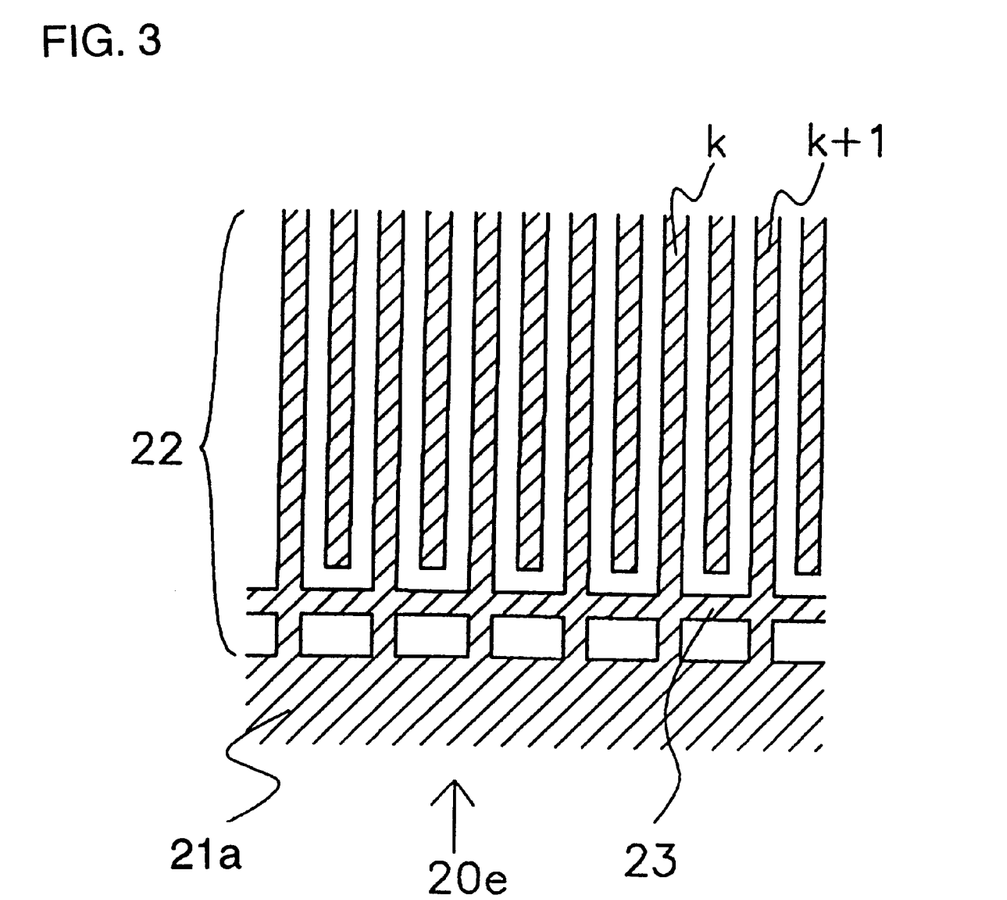
FIG. 3 is a partial, enlarged plan view of the bus bar and fingers of a second preferred embodiment according to the present invention.

As shown in FIG. 3, a comb-shaped electrode 20e includes n electrode fingers 22 (n is a natural number equal to two or more), and a bus bar 21a. The electrode fingers 22 are connected to the bus bar 21a at one end thereof. Further, the comb-shaped electrode 20e includes a finger-connecting electrode 23 which is spaced from the bus bar 21a at a predetermined distance and extends along the bus bar 21a so as to connect between the electrode fingers 22. As a result, the kth finger (k is a natural number of 1 through n−1) and the (k+1)th finger of the comb-shaped electrode 20e are connected to each other through a finger connecting electrode 23 provided in the vicinity of the connection locations between the bus bar 21a and the fingers 22. In this configuration, even if a defect is caused in the connection portion between the kth finger of the comb-shaped electrode 20e and the bus bar 21a, the kth finger is kept in its conduction state through the finger connecting electrode 23 and the other fingers. Thus, the connection portions between the kth finger and the bus bar 21a are increased in number. As a result, there is a greatly reduced probability that the insertion loss is increased and the frequency band is changed, which results from disconnection between the bus bar 21a and the kth finger.

A third preferred embodiment of the present invention will be described below. The description of like parts in the above-described preferred embodiments is omitted, and only the connection between the bus bar and the fingers of the comb-shaped electrode will be described with reference to FIG. 4.

Figure 4:
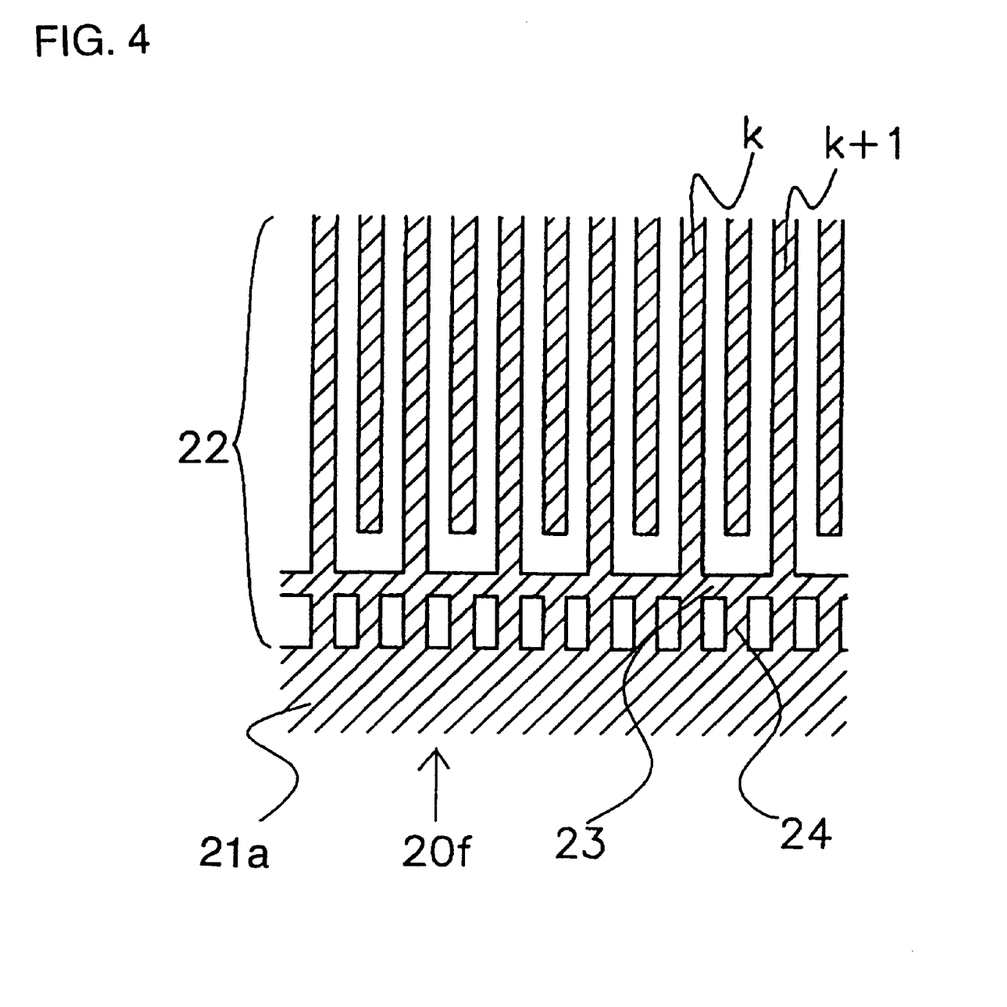
FIG. 4 is a partial, enlarged plan view of the bus bar and fingers of a third preferred embodiment according to the present invention.

As shown in FIG. 4, a comb-shaped electrode 20f is different from the comb-shaped electrode 20e in that the comb-shaped electrode 20f further includes the bus bar connecting electrodes 24 which are provided between each adjacent pair of electrode fingers 22 along the electrode fingers 22 and are connected to the finger connecting electrode 23 and the bus bar 21a. Thus, the connecting routes or portions between the kth electrode finger and the bus bar 21a are increased in number, which greatly reduces the possibility that the insertion loss is increased and the frequency band is changed by disconnection of electrode fingers.

In the preferred embodiments, the comb-shaped electrodes 20a, 20b, 20e, and 20f, and the bonding pads 13a, 13b, 13c, and 13d are preferably formed by photolithography. In the first preferred embodiment, the connection portions or routes ka and kb into which the finger k is branched, are preferably formed together with the comb-shaped electrodes 20a, 20b, 20e, and 20f, and the bonding pads 13a, 13b, 13c, and 13d, via photolithography. In the second and third preferred embodiments, the finger connecting electrode 23 and the bus bar connecting electrode 24 are preferably formed together with the comb-shaped electrodes 20a, 20b, 20e, and 20f, and the bonding pads 13a, 13b, 13c, and 13d, via photolithography. In this process, the connecting portions or routes ka and kb, the finger connecting electrode 23, and the bus bar connecting electrode 24 are formed so that the line widths thereof are nearly equal to the line width of the electrode fingers 22. If the line widths are formed so as to have a narrow width as compared with the finger k, the electric resistances are increased in the narrow portions, causing the insertion loss to increase. If the line widths are formed so as to be larger than a width of the finger k, the probability of a defect occurring becomes high since the line areas are increased. Accordingly, for the characteristics of the surface acoustic wave device 30, it is most preferable that the line widths of the connection portions ka and kb, the finger connecting electrode 23, and the bus bar connecting electrode 24 are nearly equal to the line width of the finger k.

Last, a fourth preferred embodiment of the present invention will be described. The description of like parts in the above-described preferred embodiments is omitted, and only the connection between the bus bar and the fingers of the comb-shaped electrode will be explained with reference to FIG. 5.

Figure 5:
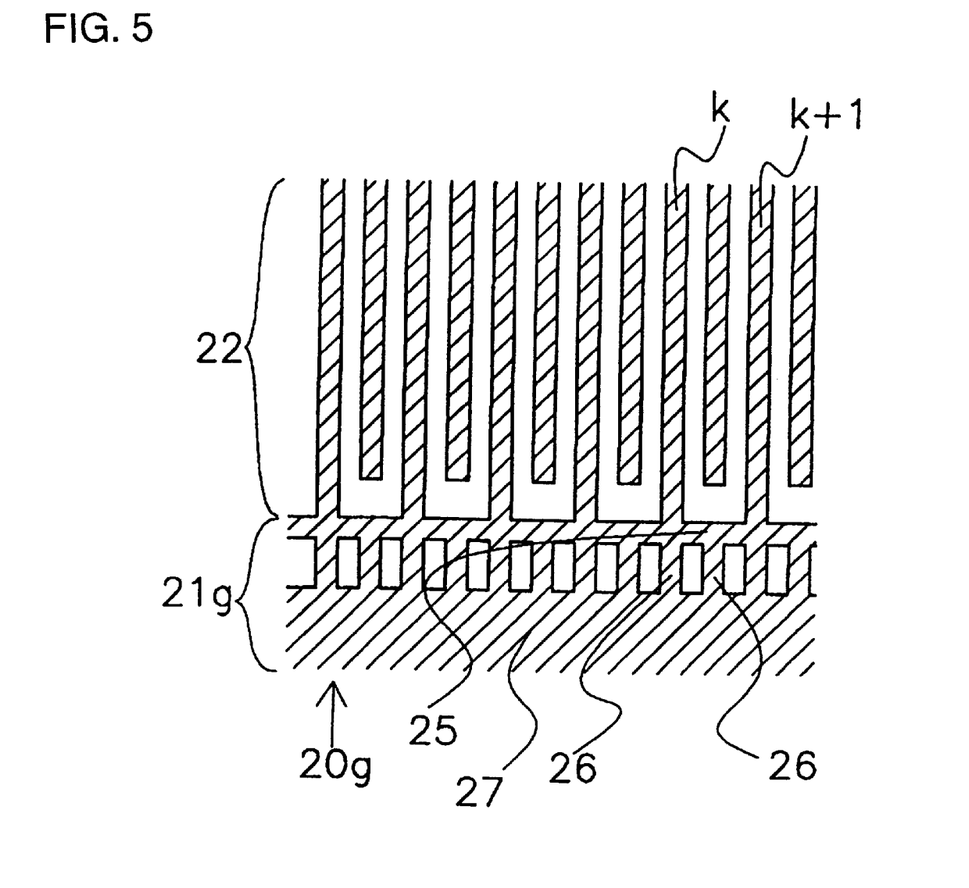
FIG. 5 is a partial, enlarged plan view of the bus bar and fingers of a fourth preferred embodiment according to the present invention.

In this preferred embodiment, a comb-shaped electrode 20g preferably includes n (n is a natural number equal to two or more) electrode fingers 22 and a bus bar 21g. A part of the bus bar 21g in the vicinity of the connection locations between the fingers 22 and the bus bar 21g is removed. More specifically, the fingers 22 which are adjacent to each other and connected to the same bus bar 21g are connected to each other through a remaining bus bar 25 which is not removed. The remaining bus bar 25 and a substantial bus bar 27 having a wide area are connected through a plurality of bridging bus bars 26. With this configuration, even if a defect is caused in the connection portion between one of the bridging bus bars 26 and the substantial bus bar 27 of the comb-shaped electrode 20g so as to cause disconnection therebetween, the fingers 22 are kept in the conducting state through the remaining bus bar 25 and the other bridging bus bars 26. Accordingly, the number of connecting routes or portions between the fingers 22 and the substantial bus bar 27 is increased. Thus, there is much less probability that the disconnection between the substantial bus bar 27 and the bridging bus bar 26 causes the insertion loss to increase and the frequency band to change.

Also in this preferred embodiment, for the above-described reason, the remaining bus bar 25 and the bridging bus bars 26 preferably have a line width that is substantially equal to that of the fingers 22.

The present invention is applicable to a surface acoustic wave device in which comb-shaped electrodes are provided on a piezoelectric film formed on a piezoelectric substrate, or a piezoelectric film is formed on a piezoelectric substrate containing comb-shaped electrodes. The present invention is applicable to other resonator surface acoustic wave filters, in addition to a transversal surface acoustic wave filter.

As is explained with reference to preferred embodiments according to the present invention, in the comb-shaped electrode of the surface acoustic wave device, the connection between a finger and the bus bar is achieved through at least two connection portions or routes at two different, independent locations. Accordingly, even if a defect occurs in the connection portion between the finger and the bus bar, the finger and the bus bar are kept in the conducting state through the other connecting portion having no defect. Thus, increasing of the insertion loss and changing of the frequency band, which are caused by disconnection between the bus bar and the finger, are reliably prevented. As a result, a surface acoustic wave device having a high reliability can be provided.

According to the present invention, in the comb-shaped electrode of the surface acoustic wave device, fingers which are adjacent to each other are connected to the same bus bar and are connected through the finger connecting electrode. Moreover, the finger connecting electrode and the bus bar are connected through the bus bar connecting electrodes. Consequently, increasing of the insertion loss and changing of the frequency band, which are caused by disconnection between the bus bar and a finger, are reliably prevented without requiring more manufacturing steps or a more difficult forming process, as compared with formation of conventional comb-shaped electrodes via photolithography.

According to preferred embodiments of the present invention, the line widths of connection electrodes, such as the finger connecting electrode, and the bus bar connecting electrode, into which a finger is branched are preferably substantially equal to the line width of the finger. As a result, any increase in the insertion loss, caused by increase of the electric resistance, and any increase in the occurrence of defects are reliably prevented.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:
1. A surface acoustic wave device comprising:
   a piezoelectric substrate;
   a plurality of comb-shaped electrodes each having a bus bar and a plurality of fingers disposed on said piezoelectric substrate; and
   a finger connecting electrode;
   wherein at least one of said fingers and said bus bar are connected to each other through at least two connecting routes, and adjacent ones of said fingers which are connected to the same bus bar are connected to each other via said finger connecting electrode provided near areas of connection between said fingers and said bus bar, said at least two connecting routes comprise at least two separate connecting electrodes arranged to connect the finger to the bus bar, and a line width of each of said two connecting electrodes and said finger connecting electrode are substantially equal to the line width of said fingers.
2. A surface acoustic wave device according to claim 1, wherein said at least two connecting routes comprise at least two separate connecting electrodes.
3. A surface acoustic wave device according to claim 1, wherein said at least two connecting routes are completely isolated from each other and are located at two different locations on said piezoelectric substrate.
4. A surface acoustic wave device according to claim 1, further comprising a bus bar connecting electrode, wherein said finger connecting electrode and said bus bar are connected to each other via said bus bar connecting electrode.

5. A surface acoustic wave device comprising:

a piezoelectric substrate; and a plurality of comb-shaped electrodes each having a bus bar and a plurality of fingers disposed on said piezoelectric substrate, said bus bar and said plurality of fingers being connected to each other at a plurality of connection locations, wherein a portion of said bus bar located near at least one of the connection locations between said bus bar and said fingers is removed so that a remaining bus bar is provided, and adjacent ones of said fingers which are connected to the same bus bar are connected to each other via said remaining bus bar near the connection locations between said bus bar and said fingers;

wherein the portion of said bus bar located near at least one of the connection locations between said bus bar and said fingers is removed so that bridging bus bars and a substantial bus bar are provided, the remaining bus bar being arranged so that the remaining bus bar connects adjacent ones of said fingers to each other and said bridging bus bars connect said remaining bus bar to said substantial bus bar, at least one of said fingers and said substantial bus bar are connected to each other through at least two connecting routes comprising at least two separate connecting electrodes, and a line width of each of said two connecting electrodes connecting the finger to said substantial bus bar, said remaining bus bar, and said bridging bus bars are substantially equal to the line width of said fingers.

* * * * *